United States Patent
Roy et al.

(10) Patent No.: US 10,153,318 B2
(45) Date of Patent: Dec. 11, 2018

(54) IMAGE SENSOR DEVICE WITH FIRST AND SECOND SOURCE FOLLOWERS AND RELATED METHODS

(71) Applicant: STMICROELECTRONICS (CROLLES 2) SAS, Crolles (FR)

(72) Inventors: François Roy, Seyssins (FR); Frédéric Lalanne, Bernin (FR); Pierre Emmanuel Marie Malinge, La Tessoualle (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 70 days.

(21) Appl. No.: 15/266,405

(22) Filed: Sep. 15, 2016

(65) Prior Publication Data

US 2017/0005130 A1 Jan. 5, 2017

Related U.S. Application Data

(63) Continuation of application No. 14/587,401, filed on Dec. 31, 2014, now Pat. No. 9,570,498.

(51) Int. Cl.
*H01L 27/146* (2006.01)
*H04N 5/378* (2011.01)

(52) U.S. Cl.
CPC .. *H01L 27/14643* (2013.01); *H01L 27/14612* (2013.01); *H01L 27/14636* (2013.01); *H01L 27/14638* (2013.01); *H01L 27/14641* (2013.01); *H01L 27/14689* (2013.01); *H04N 5/378* (2013.01)

(58) Field of Classification Search
CPC .................. H01L 27/14612; H04N 5/3745
See application file for complete search history.

(56) References Cited

U.S. PATENT DOCUMENTS

| | | | |
|---|---|---|---|
| 6,697,114 B1 | 2/2004 | Merrill | |
| 2005/0082461 A1 | 4/2005 | Bock | |
| 2009/0057544 A1 | 3/2009 | Brodie et al. | |
| 2010/0182465 A1* | 7/2010 | Okita | H04N 5/343 348/273 |
| 2013/0256509 A1 | 10/2013 | Yang et al. | |

FOREIGN PATENT DOCUMENTS

KR 100871797 B1 12/2008

* cited by examiner

*Primary Examiner* — Thanh Luu
(74) *Attorney, Agent, or Firm* — Slater Matsil, LLP

(57) ABSTRACT

An image sensor device may include an array of image sensing pixels arranged in rows and columns. Each image sensing pixel may include an image sensing photodiode, a first source follower transistor coupled to the image sensing photodiode, and a switch coupled to the image sensing photodiode. Each image sensor device may include a second source follower transistor coupled to the switch, and a row selection transistor coupled to the first and second source follower transistors.

18 Claims, 6 Drawing Sheets

IMAGE SENSOR DEVICE WITH FIRST AND SECOND SOURCE FOLLOWERS AND RELATED METHODS

RELATED APPLICATION

This application is a continuation of application Ser. No. 14/587,401, filed Dec. 31, 2014, the entire subject matter of which is incorporated herein by reference in its entirety.

TECHNICAL FIELD

The present disclosure relates to the field of integrated circuits, and, more particularly, to an image sensor device and related methods.

BACKGROUND

Typically, electronic devices include one or more camera modules for providing enhanced media functionality. For example, the typical electronic device may utilize the camera modules for photo capturing and video teleconferencing. In the typical electronic device with multiple camera modules, the primary camera module has a high pixel density and an adjustable focus lens system, while the secondary camera module is front-facing and has a lower pixel density. Also, the secondary camera module may have a fixed focus lens system.

For example, U.S. Patent Application No. 2009/0057544 to Brodie et al, assigned to the present application's assignee, discloses a camera module for a mobile device. The camera module comprises a lens, a housing carrying the lens, and a lens cap over the lens and housing. The camera module includes a barrel mechanism for adjusting the lens. Each camera module comprises an integrated circuit (IC) image sensor device having a plurality of pixels arranged in an array of rows and columns, a plurality of pixel lines coupled to the plurality of pixels, and readout circuitry coupled to the plurality of pixel lines.

SUMMARY

Generally, an image sensor device may include an array of image sensing pixels arranged in rows and columns. Each image sensing pixel may comprise an image sensing photodiode, a first source follower transistor coupled to the image sensing photodiode, at least one switch coupled to the image sensing photodiode, a second source follower transistor coupled to the at least one switch, and a row selection transistor coupled to the first and second source follower transistors.

The at least one switch may comprise a third transistor having first and second conduction terminals coupled respectively to the image sensing photodiode and to the second source follower transistor. The at least one switch may comprise a fourth transistor coupled between a first reference voltage and the third transistor.

In other embodiments, the at least one switch may comprise third and fourth transistors coupled in series between the image sensing photodiode and a first reference voltage and defining a node therebetween. The second source follower transistor may be coupled to the node.

In some embodiments, the at least one switch may comprise a third transistor coupled to the second source follower transistor and configured to operate based upon a reset signal. Also, each image sensing pixel may comprise a transfer transistor coupled between the image sensing photodiode and the at least one switch. Each image sensing pixel may comprise a reset transistor coupled between a second reference voltage and the transfer transistor. Each image sensing pixel may comprise an other switch coupled between a second reference voltage and the second source follower transistor.

Another aspect is directed to an electronic device. The electronic device may include a processor, and an array of image sensing pixels coupled to the processor and arranged in rows and columns. Each image sensing pixel may include an image sensing photodiode, a first source follower transistor coupled to the image sensing photodiode, at least one switch coupled to the image sensing photodiode, a second source follower transistor coupled to the at least one switch, and a row selection transistor coupled to the first and second source follower transistors.

Another aspect is directed to a method for making an image sensor device. The method may include forming an array of image sensing pixels arranged in rows and columns. Each image sensing pixel may include an image sensing photodiode, and a first source follower transistor coupled to the image sensing photodiode. Each image sensing pixel may include at least one switch coupled to the image sensing photodiode, a second source follower transistor coupled to the at least one switch, and a row selection transistor coupled to the first and second source follower transistors.

DETAILED DESCRIPTION

Figure 1:
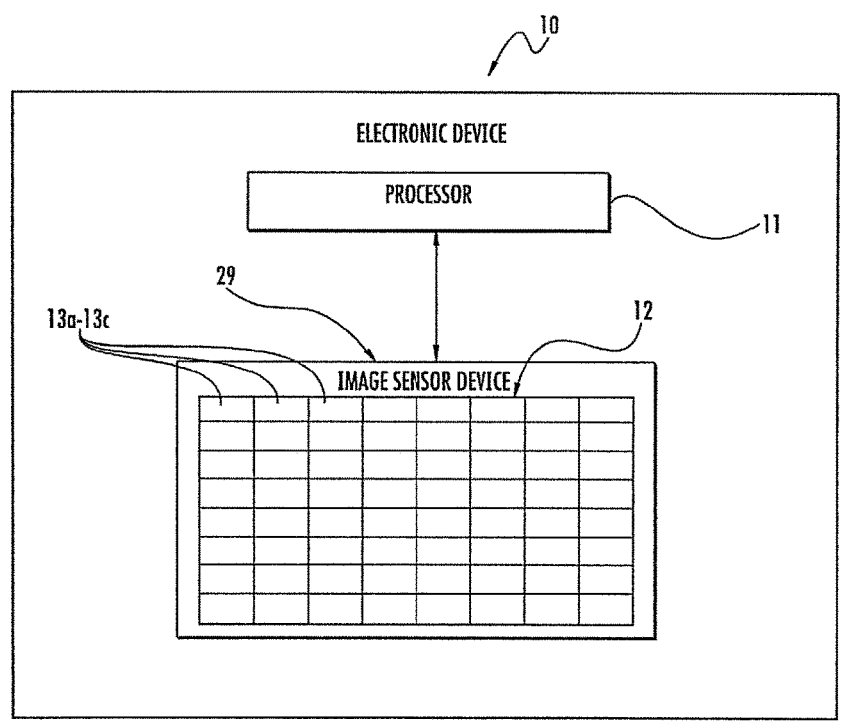
FIG. 1 is a schematic diagram of an electronic device, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Figure 2:
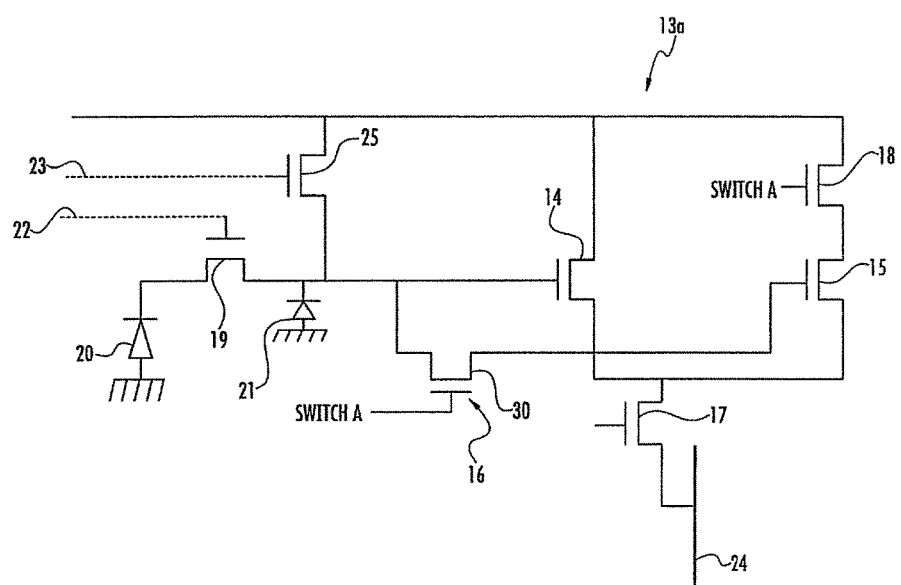
FIG. 2 is a schematic diagram of an embodiment of an image sensing pixel, according to the present disclosure.

Referring initially to FIGS. 1-2, an electronic device 10 according to the present disclosure is now described. The electronic device 10 illustratively includes a processor 11, and an image sensor device 29 coupled to the processor. The image sensor device 29 illustratively includes an array 12 of image sensing pixels 13a-13c arranged in rows and columns. Although only the image sensing pixel 13a is shown in detail in FIG. 2, it should be appreciated that the other image sensing pixels in the array 29 have similar structure.

Each image sensing pixel 13a-13c illustratively includes an image sensing photodiode 20 having an anode coupled to a first reference voltage (e.g. ground) and a cathode, and a transfer transistor 19 having a first conduction terminal coupled to the cathode of the image sensing photodiode, a control terminal coupled to a read command signal node 22, and a second conduction terminal.

Each image sensing pixel 13a-13c illustratively includes a sensing node photodiode 21 having an anode coupled to the first reference voltage and a cathode coupled to the second conduction terminal of the transfer transistor 19. Also, each image sensing pixel 13a-13c illustratively includes a reset transistor 25 having a control terminal coupled to a reset command signal node 23, a first conduction terminal coupled to a second reference voltage, and a second conduction terminal coupled to the second conduction terminal of the transfer transistor 19 and the cathode of the sensing node photodiode 21.

Moreover, each image sensing pixel 13a-13c illustratively includes a first source follower transistor 14 having a control terminal coupled to the second conduction terminal of the transfer transistor 19 and the cathode of the sensing node photodiode 21, thereby coupling it to the image sensing photodiode 20, a first conduction terminal coupled to the second reference voltage, and a second conduction terminal.

Each image sensing pixel 13a-13c illustratively includes a switch 16 coupled to the second conduction terminal of the transfer transistor 19 and the cathode of the sensing node photodiode 21, thereby coupling it to the image sensing photodiode 20. Furthermore, each image sensing pixel 13a-13c illustratively includes a second source follower transistor 15 having a control terminal coupled to the switch 16, a first conduction terminal, and as second conduction terminal.

Each image sensing pixel 13a-13c illustratively includes a row selection transistor 17 having a first conduction terminal coupled to the second conduction terminals of the first and second source follower transistors 14, 15, a control terminal, and a second conduction terminal coupled to a respective column line 24. In this illustrated embodiment, the switch 16 comprises a third transistor 30 having first and second conduction terminals coupled respectively to the image sensing photodiode 20 and to the control terminal of the second source follower transistor 15, and a control terminal coupled to a switch command signal Switch A.

Each image sensing pixel 13a-13c illustratively includes a fourth transistor 18 having a control terminal coupled to the same switch command signal Switch A (i.e. transistors 18, 30 have the same conduction state), a first conduction terminal coupled to the second reference voltage, and a second conduction terminal coupled to the first conduction terminal of the second source follower transistor 15.

As will be appreciated, the circuitry of each pixel 13a-13c converts the charge generated by the image sensing photodiode 20 into a voltage signal for readout to other circuitry. Advantageously, the second source follower transistor 15 may add extra capacitance to the sensing node of the image sensing photodiode 20. Also, the noise in the voltage signal may be reduced, and the transconductance may be improved. Additionally, the frame rate and image quality of the pixel 13a-13c may be increased.

Another aspect is directed to a method for making an image sensor device 29. The method may include forming an array 12 of image sensing pixels 13a-13c arranged in rows and columns. Each image sensing pixel 13a-13c may include an image sensing photodiode 20, and a first source follower transistor 14 coupled to the image sensing photodiode. Each image sensing pixel may include at least one switch 16 coupled to the image sensing photodiode 20, a second source follower transistor 15 coupled to the at least one switch, and a row selection transistor 17 coupled to the first and second source follower transistors 14, 15.

Figure 3:
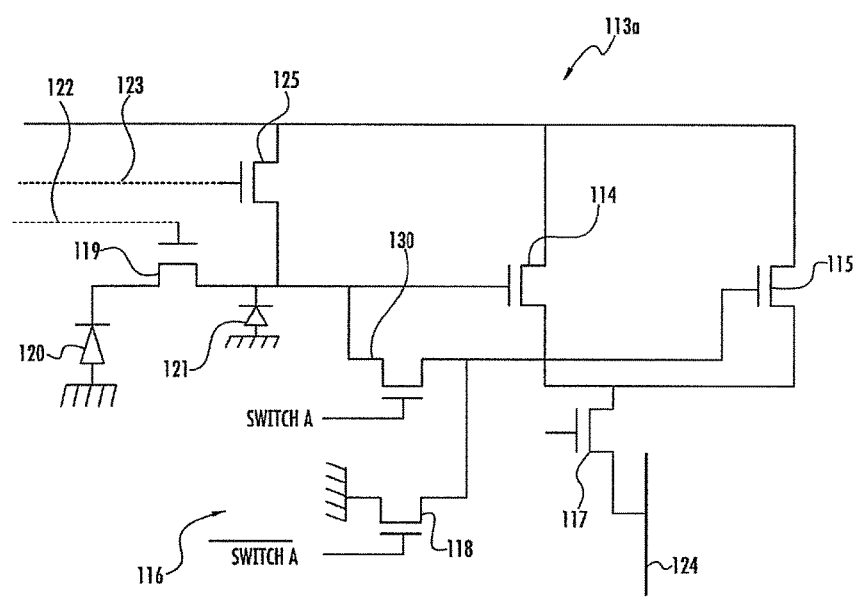
FIG. 3 is a schematic diagram of another embodiment of an image sensing pixel, according to the present disclosure.

Referring now additionally to FIG. 3, another embodiment of the image sensing pixel 113 is now described. In this embodiment of the image sensing pixel 113, those elements already discussed above with respect to FIGS. 1-2 are incremented by 100 and most require no further discussion herein. This image sensing pixel 113 has the switch 116 comprising the third transistor 130, and the fourth transistor 118. In this embodiment, the fourth transistor 118 has a first conduction terminal coupled to the first reference voltage, a control terminal, and a second conduction terminal coupled to the second conduction terminal of the third transistor 130. In this embodiment, the third transistor 130, and the fourth transistor 118 have their respective control terminals coupled to first and second switch command signals Switch A, Switch A , which are inverted to each other (i.e. complementary switch conduction states). Also, the fourth transistor 118 is used to turn off the second source follower transistor 115.

Figure 4:
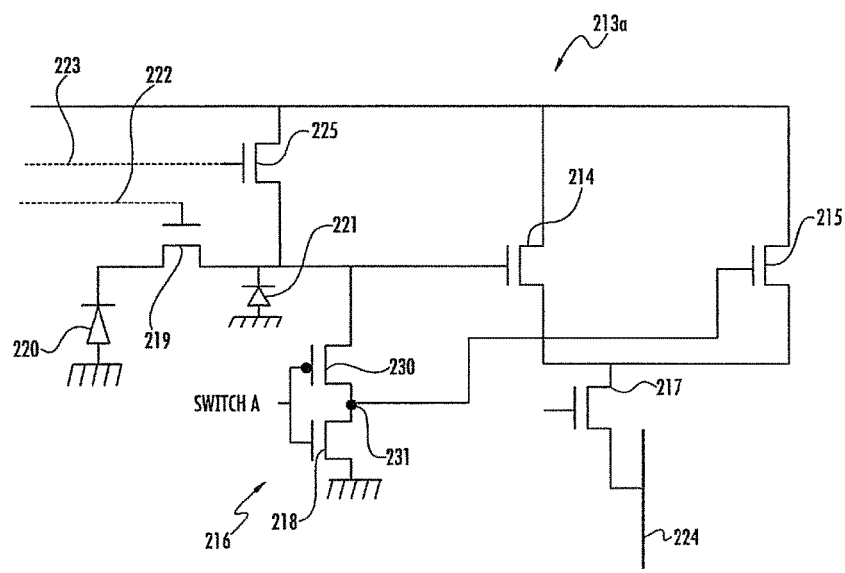
FIG. 4 is a schematic diagram of yet another embodiment of an image sensing pixel, according to the present disclosure.

Referring now additionally to FIG. 4, another embodiment of the image sensing pixel 213 is now described. In this embodiment of the image sensing pixel 213, those elements already discussed above with respect to FIGS. 1-2 are incremented by 200 and most require no further discussion herein. This image sensing pixel 213 illustratively includes the switch 216 comprising third and fourth transistors 230, 218 coupled in series between the image sensing photodiode 230 and the first reference voltage and defining a node 231 therebetween, the control terminals being coupled to switch command signal Switch A. The second source follower transistor 215 has its control terminal coupled to the node 231.

Figure 5:
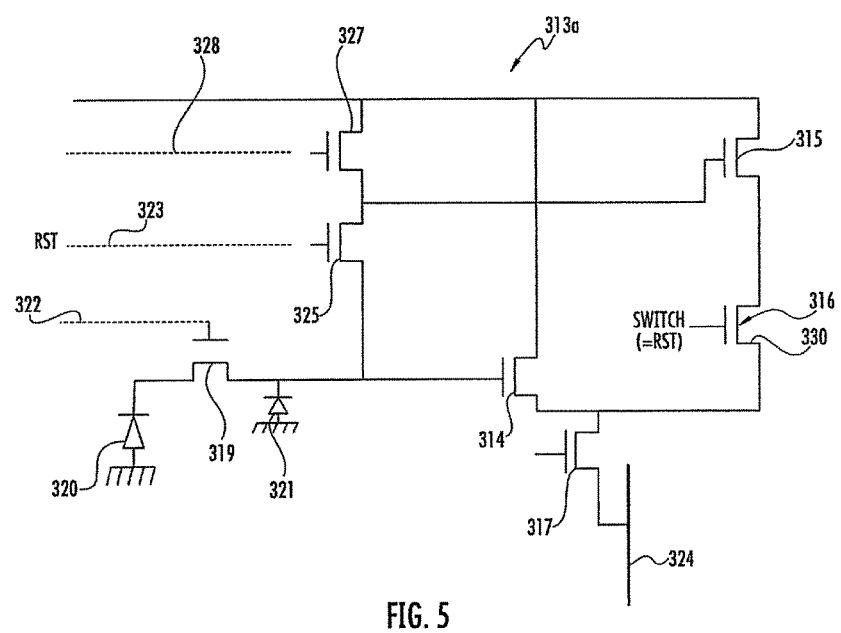
FIG. 5 is a schematic diagram of another embodiment of an image sensing pixel, according to the present disclosure.

Referring now additionally to FIG. 5, another embodiment of the image sensing pixel 313 is now described. In this embodiment of the image sensing pixel 313, those elements already discussed above with respect to FIGS. 1-2 are incremented by 300 and most require no further discussion herein. This image sensing pixel 313 illustratively includes the switch 316 comprising the third transistor 330 coupled to the second source follower transistor 315 and configured to operate based upon a reset signal, i.e. the switch command signal comprises the reset signal from the reset command signal node 323. Also, the image sensing pixel 13a-13c illustratively includes an other switch 327 coupled between the second reference voltage and the second source follower transistor 315. In particular, the other switch 327 comprises a transistor having a first conduction terminal coupled to the second reference voltage, a second conduction terminal coupled to the first conduction terminal of the reset transistor 325 and the control terminal of the second source follower transistor 315, and a control terminal coupled to switch reset control signal node 328.

Figure 6:
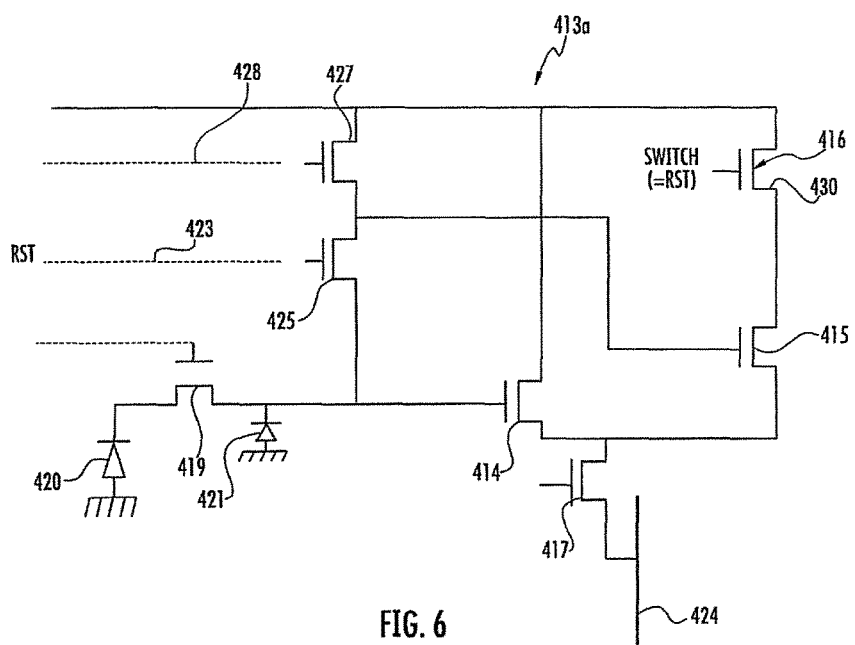
FIG. 6 is a schematic diagram of another embodiment of an image sensing pixel, according to the present disclosure.

Referring now additionally to FIG. 6, another embodiment of the image sensing pixel 413 is now described. In this embodiment of the image sensing pixel 413, those elements already discussed above with respect to FIGS. 1-2 and 5 are incremented by 400 and most require no further discussion herein. This image sensing pixel 413 differs from the embodiment of FIG. 4 in that the position of the second source follower transistor 415 and the third transistor 430 are swapped.

Many modifications and other embodiments of the present disclosure will come to the mind of one skilled in the art That which is claimed is:

1. An image sensor device comprising:
an array of image sensing pixels arranged in rows and columns, each image sensing pixel comprising:
an image sensing photodiode;
a first source follower transistor controllably coupled to said image sensing photodiode, wherein the first source follower transistor comprises a first conduction terminal, a second conduction terminal, and a control terminal;
a second source follower transistor comprising a first conduction terminal, a second conduction terminal, and a control terminal, wherein the second conduction terminal of the first source follower transistor is coupled to form a node with the second conduction terminal of the second source follower transistor;
a row selection transistor coupled to the first source follower transistor; and
at least one switch comprising a third transistor having first and second conduction terminals coupled respectively to the first conduction terminal of said first source follower transistor and to the first conduction terminal of said second source follower transistor.

2. The image sensor device of claim 1 wherein said first conduction terminal of said third transistor is directly coupled to said row selection transistor.

3. The image sensor device of claim 1 wherein said first conduction terminal of said third transistor is directly coupled to a second reference voltage, and wherein the second conduction terminal of the first source follower transistor and the second conduction terminal of the second source follower transistor are directly coupled to the row selection transistor.

4. The image sensor device of claim 1 wherein said third transistor is configured to operate based upon a reset signal.

5. The image sensor device of claim 1 wherein each image sensing pixel comprises a transfer transistor coupled between said image sensing photodiode and said at least one switch.

6. The image sensor device of claim 5 wherein each image sensing pixel comprises a reset transistor coupled between a second reference voltage and said transfer transistor.

7. An electronic device comprising:
a processor; and
an array of image sensing pixels coupled to said processor and arranged in rows and columns, each image sensing pixel comprising:
an image sensing photodiode;
a first source follower transistor controllably coupled to said image sensing photodiode, wherein the first source follower transistor comprises a first conduction terminal, a second conduction terminal, and a control terminal;
a second source follower transistor comprising a first conduction terminal, a second conduction terminal, and a control terminal, wherein the second conduction terminal of the first source follower transistor is coupled to form a node with the second conduction terminal of the second source follower transistor;
a row selection transistor coupled to the first source follower transistor; and
at least one switch comprising a third transistor having first and second conduction terminals coupled respectively to the first conduction terminal of said first source follower transistor and to the first conduction terminal of said second source follower transistor.

8. The electronic device of claim 7 wherein said first conduction terminal of said third transistor is directly coupled to said row selection transistor.

9. The electronic device of claim 7 wherein said first conduction terminal of said third transistor is directly coupled to a second reference voltage, and wherein the second conduction terminal of the first source follower transistor and the second conduction terminal of the second source follower transistor are directly coupled to the row selection transistor.

10. The electronic device of claim 7 wherein said third transistor is configured to operate based upon a reset signal.

11. The electronic device of claim 7 wherein each image sensing pixel comprises a transfer transistor coupled between said image sensing photodiode and said at least one switch.

12. The electronic device of claim 11 wherein each image sensing pixel comprises a reset transistor coupled between a second reference voltage and said transfer transistor.

13. A method for making an image sensor device, the method comprising:
forming an array of image sensing pixels arranged in rows and columns, each image sensing pixel comprising:
an image sensing photodiode;
a first source follower transistor controllably coupled to the image sensing photodiode, wherein the first source follower transistor comprises a first conduction terminal, a second conduction terminal, and a control terminal;
a second source follower transistor comprising a first conduction terminal, a second conduction terminal, and a control terminal, wherein the second conduction terminal of the first source follower transistor is coupled to form a node with the second conduction terminal of the second source follower transistor;
a row selection transistor coupled to the first source follower transistor; and
at least one switch comprising a third transistor having first and second conduction terminals coupled respectively to the first conduction terminal of the first source follower transistor and to the first conduction terminal of the second source follower transistor.

14. The method of claim 13 wherein the first conduction terminal of the third transistor is directly coupled to the row selection transistor.

15. The method of claim 13 wherein the first conduction terminal of the third transistor is directly coupled to a second reference voltage, and wherein the second conduction terminal of the first source follower transistor and the second conduction terminal of the second source follower transistor are directly coupled to the row selection transistor.

16. The method of claim 13 wherein the third transistor is configured to operate based upon a reset signal.

17. The method of claim 13 wherein each image sensing pixel comprises a transfer transistor coupled between the image sensing photodiode and the at least one switch.

18. The method of claim 17 wherein each image sensing pixel comprises a reset transistor coupled between a second reference voltage and the transfer transistor.

* * * * *